US011795390B2

(12) United States Patent
Yamasuge et al.

(10) Patent No.: US 11,795,390 B2
(45) Date of Patent: Oct. 24, 2023

(54) COATED PHOSPHOR METHOD FOR PRODUCING SAME, PHOSPHOR SHEET, AND LIGHT-EMITTING DEVICE

(71) Applicant: Dexerials Corporation, Tokyo (JP)

(72) Inventors: Takehiro Yamasuge, Tokyo (JP); Moriaki Abe, Tokyo (JP); Kazuhiro Yagihashi, Tokyo (JP); Tsuneo Kusunoki, Tokyo (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 17/966,329

(22) Filed: Oct. 14, 2022

(65) Prior Publication Data

US 2023/0056208 A1 Feb. 23, 2023

Related U.S. Application Data

(62) Division of application No. 16/764,981, filed as application No. PCT/JP2018/041031 on Nov. 5, 2018.

(30) Foreign Application Priority Data

Nov. 30, 2017 (JP) .................. 2017-230485
Oct. 25, 2018 (JP) .................. 2018-200527

(51) Int. Cl.
*C09K 11/77* (2006.01)
*B05D 3/02* (2006.01)
*C09K 11/02* (2006.01)
*F21V 8/00* (2006.01)
*G02F 1/13357* (2006.01)
*G02F 1/1335* (2006.01)

(52) U.S. Cl.
CPC ........ *C09K 11/7731* (2013.01); *B05D 3/0254* (2013.01); *C09K 11/025* (2013.01); *G02B 6/005* (2013.01); *G02F 1/133603* (2013.01); *G02F 1/133606* (2013.01); *G02F 1/133614* (2021.01)

(58) Field of Classification Search
CPC .................. C09K 11/025; C09K 11/7731
See application file for complete search history.

(56) References Cited

U.S. PATENT DOCUMENTS

| 7,202,598 B2 * | 4/2007 | Juestel | C09K 11/025 |
| | | | 313/503 |
| 10,608,148 B2 | 3/2020 | Gresback et al. | |
| 2002/0105266 A1 | 8/2002 | Juestel et al. | |
| 2006/0159853 A1 | 7/2006 | Chung et al. | |
| 2006/0192486 A1 * | 8/2006 | Ogawa | H05B 33/14 |
| | | | 313/509 |
| 2006/0255713 A1 * | 11/2006 | Kondo | H01L 24/32 |
| | | | 313/486 |
| 2007/0267965 A1 * | 11/2007 | Igarashi | C09K 11/7731 |
| | | | 313/501 |
| 2008/0180018 A1 | 7/2008 | Minamoto et al. | |
| 2009/0021141 A1 | 1/2009 | Emoto et al. | |
| 2010/0164367 A1 | 7/2010 | Shioi et al. | |
| 2010/0200874 A1 | 8/2010 | Shioi et al. | |
| 2012/0119234 A1 | 5/2012 | Shioi et al. | |
| 2013/0256715 A1 | 10/2013 | Itoh et al. | |
| 2014/0293609 A1 | 10/2014 | Daimon et al. | |
| 2016/0222287 A1 | 8/2016 | Yagihashi | |
| 2016/0315231 A1 | 10/2016 | Gootz et al. | |
| 2018/0305243 A1 | 10/2018 | Kadomi et al. | |

FOREIGN PATENT DOCUMENTS

| CN | 1255883 C | 5/2006 |
| CN | 101796157 A | 8/2010 |
| CN | 105555914 A | 5/2016 |
| EP | 1858303 A2 | 11/2007 |
| JP | 10060428 A | 3/1998 |
| JP | 2003034790 A | 2/2003 |
| JP | 2006-188700 A | 7/2006 |
| JP | 2006188700 A | 7/2006 |
| JP | 2006-265326 A | 10/2006 |
| JP | 2006-265506 A | 10/2006 |
| JP | 2006265326 A | 10/2006 |
| JP | 2006265506 A | 10/2006 |
| JP | 2008-115223 A | 5/2008 |
| JP | 2008115223 A | 5/2008 |
| JP | 2009-256558 A | 11/2009 |
| JP | 2009256558 A | 11/2009 |
| JP | 2009-286995 A | 12/2009 |
| JP | 2009286995 A | 12/2009 |
| JP | 2011-037913 A | 2/2011 |
| JP | 2011026535 A | 2/2011 |
| JP | 2011037913 A | 2/2011 |
| JP | 2013119581 A | 6/2013 |
| JP | 2015-059202 A | 3/2015 |

(Continued)

OTHER PUBLICATIONS

International Search Report dated Jan. 29, 2019 issued in corresponding International Patent Application No. PCT/JP2018/041031.
Chinese Office action dated Jun. 20, 2022 issued for corresponding Chinese patent application No. 201880076292.3.
Martin, Lisa I.D.J. et al., "Microscopic Study of Dopant Distribution in Europium Doped SrGa2S4: Impact on Thermal Quenching and Phosphor Performance," ECS Journal of Solid State Science and Technology, 7 (1) R3-52-R3056, Sep. 15, 2017.
Extended European Search report issued in corresponding European Application No. 18882963.4 dated Jul. 9, 2021.
Office action issued in corresponding Japanese Application No. 2018-200527 dated Jul. 20, 2021.

(Continued)

Primary Examiner — C Melissa Koslow

(57) ABSTRACT

A coated phosphor including: an inorganic phosphor particle; and a silicon oxide coating that coats the inorganic phosphor particle, wherein a molar ratio (O/Si) of an oxygen atom to a silicon atom in the silicon oxide coating through ICP emission spectroscopy of the coated phosphor is 2.60 or less.

13 Claims, 6 Drawing Sheets

(56) References Cited

FOREIGN PATENT DOCUMENTS

| | | |
|---|---|---|
| JP | 2015063619 | 4/2015 |
| JP | 2015151456 A | 8/2015 |
| JP | 2017142381 A | 8/2017 |
| JP | 2017-168581 A | 9/2017 |
| WO | 2010103773 A1 | 9/2010 |
| WO | 2012077656 A1 | 6/2012 |
| WO | 2017081901 A1 | 5/2017 |
| WO | 2018080936 A1 | 3/2018 |
| WO | WO 2018/080936 * | 5/2018 |

OTHER PUBLICATIONS

Office action issued in corresponding Taiwanese Application No. 107142041 dated Jan. 21, 2022.

Japanese Office Action dated Jan. 10, 2023 issued for corresponding Japanese patent application No. 2021-133249.

Japanese Office Action dated Nov. 8, 2022 issued for corresponding Japanese patent application No. 2021-133249.

Written Opinion of the International Search Authority dated Jan. 29, 2019 issued in a corresponding International Patent Application No. PCT/JP2018/041031.

Written Opinion of the International Preliminary Examining Authority dated Nov. 26, 2019 issued in a corresponding International Patent Application No. PCT/JP2018/041031.

Written Opinion of the International Search Authority dated Jan. 29, 2019 issued in corresponding International Patent Application No. PCT/JP2018/041031.

Written Opinion of the International Preliminary Examining Authority dated Nov. 26, 2019 issued in corresponding International Patent Application No. PCT/JP2018/041031.

* cited by examiner 2.00 μm 2.00 μm

COATED PHOSPHOR METHOD FOR PRODUCING SAME, PHOSPHOR SHEET, AND LIGHT-EMITTING DEVICE

TECHNICAL FIELD

The present invention relates to a coated phosphor, a method for producing the same, a phosphor sheet, and a light-emitting device.

BACKGROUND ART

Conventionally, low-priced TVs and displays have used pseudo white LEDs using yellow phosphor YAG:Ce.

In recent years, liquid crystal TVs and displays have been required to have a wide color gamut. In the above systems, however, the color gamut becomes narrower because they reduce color purities of green and red. In order to widen the color gamut (achieve the wide color gamut), in place of the yellow phosphor, a three-wavelength type white LED is advantageous which uses green emission phosphor and red emission phosphor suitable for the transmission characteristics of a color filter.

Thus, inorganic phosphors of the respective colors are used in light-emitting devices.

Inorganic phosphors are more stable to the external environment than organic phosphors. Nonetheless, inorganic phosphors deteriorate over time, potentially resulting in deterioration in light-emitting properties of the inorganic phosphors.

Therefore, coating the surfaces of the inorganic phosphors with other inorganic materials has been proposed (e.g., see PTLs 1 to 3). The coating of the inorganic materials is, for example, silicon dioxide coating (e.g., see PTL 1). The silicon dioxide coating is usually formed by the sol-gel method of a silicon compound typified by a silane coupling agent.

When coated with a silicon dioxide coating on the surfaces of the inorganic phosphors, compared to the case of being uncoated, it is possible to suppress deterioration of the inorganic phosphors. Nonetheless, there has been a demand for a further increased stability, in particular, under a high-temperature, high-humidity environment in a state where light-emitting diodes (LEDs) are lit.

CITATION LIST

Patent Literature

PTL 1 Japanese Patent Application Laid-Open No. (JP-A) 2013-119581
PTL 2 International Publication No. WO2012/077656
PTL 3 Japanese Patent Application Laid-Open No. (JP-A) 2003-034790

SUMMARY OF INVENTION

Technical Problem

The present invention has been proposed under such circumstances and aims to provide: a coated phosphor of an inorganic phosphor coated with a silicon oxide coating, the coated phosphor being excellent in stability under a high-temperature, high-humidity environment in a state where LEDs are lit; a method for producing the same; and a phosphor sheet and a light-emitting device each using the coated phosphor.

Solution to Problem

Means for solving the above-described problems are as follows.

<1> A coated phosphor including:
an inorganic phosphor particle; and
a silicon oxide coating that coats the inorganic phosphor particle,
wherein a molar ratio (O/Si) of an oxygen atom to a silicon atom in the silicon oxide coating through ICP emission spectroscopy of the coated phosphor is 2.60 or less.

<2> The coated phosphor according to <1>, wherein an average thickness of the silicon oxide coating is from 3 nm to 200 nm.

<3> The coated phosphor according to <1> or <2>, wherein the inorganic phosphor particle is represented by any one of General Formula (1) to General Formula (3) below:

$$Sr_{1-x}Ga_2S_4:Eu_x \quad \text{General Formula (1);}$$

$$(Sr_{1-y}Ca_y)_{1-x}Ga_2S_4:Eu_x \quad \text{General Formula (2); and}$$

$$(Ba_zSr_{1-z})_{1-x}Ga_2S_4:Eu_x \quad \text{General Formula (3),}$$

where in the General Formulas (1) to (3), x satisfies $0<x<1$, y satisfies $0<y<1$, and z satisfies $0<z<1$.

<4> A method for forming a coated phosphor, the method including:
forming a silicon oxide coating on a surface of an inorganic phosphor particle, to obtain a coated phosphor; and
heating the coated phosphor at a temperature higher than a formation temperature of the silicon oxide coating and under an inert atmosphere.

<5> The method according to <4>, wherein the temperature at the heating is lower than 1,000° C.

<6> The method according to <4> or <5>, wherein the method produces the coated phosphor according to any one of <1> to <3>.

<7> A phosphor sheet including
the coated phosphor according to any one of <1> to <3>.

<8> A light-emitting device including
the phosphor sheet according to <7>.

Advantageous Effects of the Invention

According to the present invention, it is possible to provide: a coated phosphor of an inorganic phosphor coated with a silicon oxide coating, the coated phosphor being excellent in stability under a high-temperature, high-humidity environment in a state where LEDs are lit; a method for producing the same; and a phosphor sheet and a light-emitting device each using the coated phosphor.

DESCRIPTION OF EMBODIMENTS (Coated Phosphor)

Figure 1:
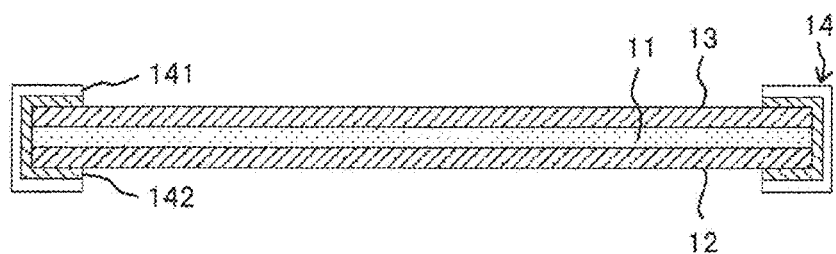
FIG. 1 is a schematic cross-sectional view illustrating an exemplary structure of the end of a phosphor sheet.

A coated phosphor of the present invention includes an inorganic phosphor particle and a silicon oxide coating, and if necessary further includes other components.

The present inventors conducted extensive studies to provide a coated phosphor of an inorganic phosphor coated with a silicon oxide coating, the coated phosphor being excellent in stability under a high-temperature, high-humidity environment in a state where LEDs are lit.

As a result, they have found that by applying heat to a silicon oxide coating after an inorganic phosphor has been coated with the silicon oxide coating, the resultant coated phosphor is excellent in stability under a high-temperature, high-humidity environment in a state where LEDs are lit.

They have also found that the molar ratio (O/Si) of the oxygen atom to the silicon atom changes by observing change in the silicon oxide coating before and after the application of heat. This is believed to result from compactness of the silicon oxide coating.

On the basis of the above findings, the present inventors have found that when the molar ratio (O/Si) of the oxygen atom to the silicon atom in the silicon oxide coating through ICP emission spectroscopy of the coated phosphor is 2.60 or less in the coated phosphor including the inorganic phosphor particle and the silicon oxide coating that coats the inorganic phosphor particle, the resultant coated phosphor is excellent in stability under a high-temperature, high-humidity environment in a state where LEDs are lit. The present invention has been completed on the basis of this finding.

The molar ratio (O/Si) of the oxygen atom to the silicon atom in the silicon oxide coating through ICP emission spectroscopy of the coated phosphor is 2.60 or less. When the ratio (O/Si) is higher than 2.60, the coated phosphor is degraded in stability under a high-temperature, high-humidity environment in a state where LEDs are lit. The lower limit of the ratio (O/Si) is not particularly limited and may be appropriately selected depending on the intended purpose. For example, the ratio (O/Si) may be 2.00 or more or may be 2.30 or more.

The ratio (O/Si) is preferably 2.00 or more but 2.60 or less, more preferably 2.30 or more but 2.55 or less, particularly preferably 2.30 or more but 2.45 or less.

The ratio (O/Si) can be determined through ICP emission spectroscopy.

When performing the ICP emission spectroscopy, a solution in which the entire coated phosphor is dissolved may be used as a measurement sample, or the silicon oxide coating is isolated from the coated phosphor and a solution in which the isolated silicon oxide coating is dissolved may be used as a measurement sample.

For example, when the alkaline fusion method (JIS R9301-3-3) using sodium carbonate is used, a solution in which the entire coated phosphor is dissolved can be used as a measurement sample.

<Inorganic Phosphor Particle>

The inorganic phosphor particle is not particularly limited and may be appropriately selected depending on the intended purpose. Examples of the inorganic phosphor particle include a green phosphor, a red phosphor, and a yellow phosphor. Among them, a green phosphor is preferable.

The peak wavelength of the green phosphor is, for example, a wavelength of from 530 nm to 550 nm.

The peak wavelength of the red phosphor is, for example, a wavelength of from 620 nm to 670 nm.

Examples of the inorganic phosphor particle include a sulfide-based phosphor, an oxide-based phosphor, a nitride-based phosphor, and a fluoride-based phosphor. These may be used alone or in combination.

The inorganic phosphor particle preferably contains sulfur as a constituent component thereof.

<<Sulfide-Based Phosphor>>

Examples of the sulfide-based phosphor include the following phosphors:
  (i) a red sulfide phosphor having a red phosphor peak in the wavelength range of from 620 nm to 670 nm when irradiated with blue excitation light (CaS:Eu (calcium sulfide (CS) phosphor), SrS:Eu);
  (ii) a green sulfide phosphor having a green phosphor peak in the wavelength range of from 530 nm to 550 nm when irradiated with blue excitation light (thiogallate (SGS) phosphor $(Sr_xMi_{1-x-y})Ga_2S_4:Eu_y$ (M is Ca, Mg, or Ba, and $0 \leq x < 1$ and $0 < y < 0.2$ are satisfied); and
  (iii) a mixture of the above green sulfide phosphor and the red sulfide phosphor $(Ca_{1-x})S:Eu_x$ ($0 < x < 0.05$ is satisfied).

Specific examples of the sulfide-based phosphor are not particularly limited and may be appropriately selected depending on the intended purpose, including CaS:Eu (calcium sulfide (CS) phosphor), SrS:Eu, $SrGa_2S_4$:Eu, $CaGa_2S_4$:Eu, $(Sr,Ca,Ba,Mg)Ga_2S_4$:Eu (thiogallate (SGS) phosphor), (Sr,Ca,Ba)S:Eu, $Y_2O_2S$:Eu, $La_2O_2S$:Eu, and $Gd_2O_2S$:Eu. These may be used alone or in combination.

<<Oxide-Based Phosphor>>

Specific examples of the oxide-based phosphor are not particularly limited and may be appropriately selected depending on the intended purpose, including $(Ba,Sr)_3ASiO_5$:Eu, $(Ba,Sr)_2SiO_4$:Eu, $Tb_3Al_5O_{12}$:Ce, and $Ca_3Sc_2Si_3O_{12}$:Ce. These may be used alone or in combination.

Further examples of the oxide-based phosphor include oxide-based phosphors that emit red fluorescent light having a wavelength of from 590 nm to 620 nm when irradiated with blue excitation light, including $(Ba, Sr)_3SiO_5$:Eu and $(Ba, Sr)_2SiO_4$:Eu as suitable examples.

<<Nitride-Based Phosphor>>

Specific examples of the nitride-based phosphor are not particularly limited and may be appropriately selected depending on the intended purpose, including $Ca_2Si_3N_8$:Eu, $Sr_2Si_5N_6$:Eu, $Ba_2Si_5N_8$:Eu, $(Ca,Sr,Ba)_2Si_5N_8$:Eu, $Ca_x(Al,$ Si)$_{12}$(O,N)$_{12}$:Eu (0<x≤1.5), CaSi$_2$O$_2$N$_2$:Eu, SrSi$_2$O$_2$N$_2$:Eu, BaSi$_2$O$_2$N$_2$:Eu, (Ca,Sr,Ba)Si$_2$O$_2$N$_2$:Eu, CaAl$_2$Si$_4$N$_8$:Eu, CaSiN$_2$:Eu, CaAlSiN$_3$:Eu, and (Sr,Ca)AlSiN$_3$:Eu. These may be used alone or in combination.

<<Fluoride-Based Phosphor>>

Specific examples of the fluoride-based phosphor are not particularly limited and may be appropriately selected depending on the intended purpose, including K$_2$TiF$_6$:Mn$^{4+}$, Ba$_2$TiF$_6$:Mn$^{4+}$, Na$_2$TiF$_6$:Mn$_4$, K$_3$ZrF$_7$:Mn$^{4+}$, and K$_2$SiF$_6$:Mn$^{4+}$. These may be used alone or in combination.

Among these inorganic phosphor particles, the coated phosphor of the present invention suitably uses the inorganic phosphor particle represented by any one of General Formula (1) to General Formula (3) below:

$$Sr_{1-x}Ga_2S_4:Eu_x \quad \text{General Formula (1);}$$

$$(Sr_{1-y}Ca_y)_{1-x}Ga_2S_4:Eu_x \quad \text{General Formula (2); and}$$

$$(Ba_zSr_{1-z})_{1-x}Ga_2S_4:Eu_x \quad \text{General Formula (3),}$$

where in the General Formulas (1) to (3), x satisfies 0<x<1, y satisfies 0<y<1, and z satisfies 0<z<1.

x preferably satisfies 0.03≤x≤0.20, more preferably 0.05≤x≤0.18.

y preferably satisfies 0.005≤y≤0.45, more preferably 0.05≤y≤0.20.

z preferably satisfies 0.005≤z≤0.45, more preferably 0.20≤z≤0.40.

<Silicon Oxide Coating>

In the coated phosphor, the silicon oxide coating coats the inorganic phosphor particle.

As the degree of coating, it is preferable to completely coat the inorganic phosphor particle. However, it is not necessary to completely coat the inorganic phosphor particle. It is enough for the inorganic phosphor particle to be coated to such an extent as to obtain the effect of the present invention.

The silicon oxide coating is not particularly limited and may be appropriately selected depending on the intended purpose as long as it is a coating of silicon oxide. As described above, when the molar ratio of the oxygen atom to the silicon atom is measured through ICP emission spectroscopy of the silicon oxide coating, the molar ratio (O/Si) is different from 2.00, which is the theoretical ratio of SiO$_2$. In this regard, it is not necessary in the present invention that the molar ratio (O/Si) of the oxygen atom to the silicon atom in the silicon oxide coating be 2.00.

The average thickness of the silicon oxide coating is not particularly limited and may be appropriately selected depending on the intended purpose. However, it is preferably from 3 nm to 200 nm, more preferably from 3 nm to 100 nm, further more preferably from 10 nm to 50 nm, particularly preferably from 10 nm to 30 nm.

The average thickness of the silicon oxide coating can be determined, for example, by observing a cross section of the coated phosphor using a scanning or transmission electron microscope and measuring the thicknesses of the silicon oxide coating at randomly selected 10 points thereof.

The silicon oxide coating may contain other components as long as the object of the present invention can be achieved. When the silicon oxide coating contains other components, the molar ratio (O/Si) is calculated as a molar ratio (O/Si) of O to Si of the silicon oxide in the silicon oxide coating.

A method for forming the silicon oxide coating is not particularly limited and may be appropriately selected depending on the intended purpose. Examples of the method include a coating step in the below-described method of the present invention for producing a coated phosphor.

The light-emission local maximum wavelength of the coated phosphor is not particularly limited and may be appropriately selected depending on the intended purpose. The light-emission local maximum wavelength of the coated phosphor is preferably from 500 nm to 600 nm.

The average particle diameter of the coated phosphor is not particularly limited and may be appropriately selected depending on the intended purpose. The average particle diameter of the coated phosphor is preferably from 0.5 μm to 30 μm, more preferably from 1 μm to 20 μm, particularly preferably from 3 μm to 15 μm.

The average particle diameter of the coated phosphor can be measured with, for example, a laser diffraction particle size analyzer (e.g., LA-960, available from HORIBA, Ltd.).

The particle diameter D90 of the coated phosphor is not particularly limited and may be appropriately selected depending on the intended purpose. The particle diameter D90 of the coated phosphor is preferably 40 μm or less, more preferably 3 μm or more but 30 μm or less, particularly preferably 5 μm or more but 25 μm or less.

As used herein, D90 refers to a value of the particle diameter at which a cumulative value is 90% in a particle size distribution of particles.

(Method for Producing Coated Phosphor)

A method of the present invention for producing a coated phosphor includes a coating step and a heating step, and if necessary further includes other steps.

<Coating Step>

The coating step is not particularly limited and may be appropriately selected depending on the intended purpose as long as it is a step of forming a silicon oxide coating on a surface of an inorganic phosphor particle to obtain a coated phosphor. One example of the coating step is a process including a treatment of immersing the inorganic phosphor particles in a liquid containing a silicon oxide precursor and a treatment of heating the inorganic phosphor particles including the silicon oxide precursor attached to the surfaces thereof. These treatments may be a so-called hydrolysis of alkoxysilane (the sol-gel process).

Examples of the silicon oxide precursor include alkoxysilane.

The alkoxysilane may be selected from, for example, ethoxide, methoxide, and isopropoxide, and examples thereof include tetraethoxysilane and tetramethoxysilane. The alkoxysilane may be alkoxysilane oligomer such as polyethyl silicate and a hydrolysis-condensation product. The alkoxysilane may be a silane coupling agent having, for example, an alkyl group, an amino group, or a mercapto group that does not contribute to the sol-gel reaction, such as alkylalkoxysilane.

The above liquid may contain a solvent. Examples of the solvent usable include water and an organic solvent.

Examples of the organic solvent usable include alcohol, ether, ketone, and polyvalent alcohols. Examples of the alcohol usable include methanol, ethanol, propanol, and pentanol. Examples of the polyvalent alcohols usable include ethylene glycol, propylene glycol, and diethylene glycol.

These solvents may be used in combination of two or more kinds thereof.

The formation of the silicon oxide coating in the coating step may be performed using a catalyst.

When the silicon oxide precursor is the alkoxysilane, the catalyst is for initiating hydrolysis or polycondensation reaction of the alkoxysilane. For example, an acid catalyst or a basic catalyst can be used. Examples of the acid catalyst include hydrochloric acid, sulfuric acid, boric acid, nitric acid, perchloric acid, tetrafluoroboric acid, hexafluoroarsenic acid, hydrobromic acid, acetic acid, oxalic acid, and methanesulfonic acid. Examples of the basic catalyst include hydroxides of alkali metals such as sodium hydroxide, and ammonia. Among these catalysts, a basic catalyst is preferably used from the viewpoint of effectively preventing degradation of the inorganic phosphor particles. Two or more kinds of these acid catalysts and basic catalysts may be used in combination as the catalyst.

<Heating Step>

The heating step is not particularly limited and may be appropriately selected depending on the intended purpose as long as it is a step of heating the coated phosphor at a temperature higher than a formation temperature of the silicon oxide coating and under an inert atmosphere.

The formation temperature of the silicon oxide coating may be, for example, 300° C. or lower, or may be from 100° C. to 250° C.

The lower limit of the temperature in the heating in the heating step is not particularly limited and may be appropriately selected depending on the intended purpose as long as it is a temperature higher than the formation temperature of the silicon oxide coating. The temperature in the heating may be, for example, 500° C. or higher or may be 550° C. or higher.

The upper limit of the temperature in the heating is not particularly limited and may be appropriately selected depending on the intended purpose. From the viewpoint of preventing coalescence of portions of the silicon oxide coating, the temperature in the heating is preferably 1,200° C. or lower, more preferably lower than 1,000° C., particularly preferably lower than 900° C.

Examples of the inert atmosphere include a nitrogen atmosphere.

It is believed that compactness of the silicon oxide coating is achieved by the heating step and the resultant coated phosphor has excellent stability under a high-temperature, high-humidity environment in a state where LEDs are lit.

(Phosphor Sheet)

A phosphor sheet of the present invention includes the coated phosphor of the present invention, preferably includes a resin, and if necessary further includes other components.

The phosphor sheet can be obtained by, for example, coating a transparent substrate with a phosphor-containing resin composition (a so-called phosphor paint) that contains the coated phosphor and the resin.

The thickness of the phosphor sheet is not particularly limited and may be appropriately selected depending on the intended purpose.

The amount of the coated phosphor in the phosphor sheet is not particularly limited and may be appropriately selected depending on the intended purpose.

<Resin>

The resin is not particularly limited and may be appropriately selected depending on the intended purpose. Examples of the resin include a thermoplastic resin and a photocurable resin.

<<Thermoplastic Resin>>

The thermoplastic resin is not particularly limited and may be appropriately selected depending on the intended purpose. Examples of the thermoplastic resin include a hydrogenated styrene-based copolymer and an acrylic copolymer.

The hydrogenated styrene-based copolymer is not particularly limited and may be appropriately selected depending on the intended purpose. Examples of the hydrogenated styrene-based copolymer include a hydrogenated product of a styrene-ethylene-butylene-styrene block copolymer.

The proportion of the styrene unit in the styrene-ethylene-butylene-styrene block copolymer is not particularly limited and may be appropriately selected depending on the intended purpose. The proportion of the styrene unit therein is preferably from 20 mol % to 30 mol %.

The acrylic copolymer is not particularly limited and may be appropriately selected depending on the intended purpose. Examples of the acrylic copolymer include a block copolymer of methyl methacrylate (MMA) and butyl acrylate (BA). When the phosphor is a sulfide, the thermoplastic resin is preferably a hydrogenated styrene-based copolymer as compared with an acrylic copolymer.

<<Photocurable Resin>>

The photocurable resin is made using a photocurable compound.

The photocurable resin is not particularly limited and may be appropriately selected depending on the intended purpose. Examples of the photocurable resin include a photocurable (meth)acrylate such as urethane (meth)acrylate. Here, the urethane (meth)acrylate is, for example, a product obtained by esterifying a product containing an isocyanate group obtained through reaction between polyol and polyisocyanate (e.g., isophorone diisocyanate), with hydroxyalkyl (meth)acrylate (e.g., 2-hydroxypropyl acrylate).

The amount of the urethane (meth)acrylate relative to 100 parts by mass of the photocurable (meth)acrylate is not particularly limited and may be appropriately selected depending on the intended purpose. The amount of the urethane (meth)acrylate is preferably 10 parts by mass or more.

<<Resin Composition>>

The resin composition containing the resin preferably contains a polyolefin copolymer component or a photocurable (meth)acrylic resin component.

The polyolefin copolymer is not particularly limited and may be appropriately selected depending on the intended purpose. Examples of the polyolefin copolymer include a styrene-based copolymer and a hydrogenated product of a styrene-based copolymer.

The styrene-based copolymer is not particularly limited and may be appropriately selected depending on the intended purpose. Examples of the styrene-based copolymer include a styrene-ethylene-butylene-styrene block copolymer and a styrene-ethylene-propylene block copolymer. Among them, a hydrogenated product of a styrene-ethylene-butylene-styrene block copolymer is preferable in terms of transparency and gas barrier property. Incorporation of the polyolefin copolymer component makes it possible to provide excellent light fastness and low water absorbability.

When the amount of the styrene unit in the hydrogenated styrene-based copolymer is too low, the mechanical strength tends to decrease. When it is too high, the resultant tends to be brittle. Thus, the amount of the styrene unit in the hydrogenated styrene-based copolymer is preferably from 10% by mass to 70% by mass, more preferably from 20% by mass to 30% by mass. When the hydrogenation rate of the hydrogenated styrene-based copolymer is too low, the weatherability tends to be degraded. Thus, the hydrogenation rate of the hydrogenated styrene-based copolymer is preferably 50% or more, more preferably 95% or more.

The photocurable acrylate resin component is not particularly limited and may be appropriately selected depending on the intended purpose. Examples of the photocurable acrylate resin component include urethane (meth)acrylate, polyester (meth)acrylate, and epoxy (meth)acrylate. Among them, urethane (meth)acrylate is preferable from the viewpoint of heat resistance after photocuring. Incorporation of such a photocurable (meth)acrylate resin component makes it possible to provide excellent light fastness and low water absorbability.

If necessary, the phosphor sheet may contain particles (diffusing materials) such as inorganic substances that absorb a very small amount of light. When the refractive index of the sealing material is different from the refractive index of the particles that are added, those particles diffuse (scatter) excitation light to be able to increase absorption of the excitation light into the coated phosphor, which makes it possible to reduce the amount of the coated phosphor added. Examples of the particles (diffusing materials) include silicone particles, silica particles, resin particles, and composite particles of melamine and silica. Examples of the resin of the resin particles include melamine, cross-linked polymethyl methacrylate, and cross-linked polystyrene. Specific examples of the above particles (diffusing materials) include commercially available products such as silicone powder KMP series available from Shin-Etsu Chemical Co., Ltd., OPTBEADS available from Nissan Chemical Industries, Ltd., and TECHPOLYMER, MBX series and SBX series available from SEKISUI PLASTICS CO., LTD.

<Transparent Substrate>

The transparent substrate is not particularly limited and may be appropriately selected depending on the intended purpose. Examples of the transparent substrate include a thermoplastic resin film, a thermosetting resin film, and a photocurable resin film (JP-A Nos. 2011-13567, 2013-32515, and 2015-967).

A material of the transparent substrate is not particularly limited and may be appropriately selected depending on the intended purpose. Examples of the material include polyester films such as a polyethylene terephthalate (PET) film and a polyethylene naphthalate (PEN) film; polyamide films; polyimide films; polysulfone films; triacetyl cellulose films; polyolefin films; polycarbonate (PC) films; polystyrene (PS) films; polyether sulfone (PES) films; cyclic amorphous polyolefin films; multifunctional acrylate films; multifunctional polyolefin films; unsaturated polyester films; epoxy resin films; and fluororesin films such as PVDF, FEP, and PFA. These may be used alone or in combination.

Among them, a polyethylene terephthalate (PET) film and a polyethylene naphthalate (PEN) film are particularly preferable.

If necessary, the surface of such a film may be subjected to, for example, a Colona discharge treatment or a silane coupling agent treatment, in order to improve adhesiveness to a phosphor-containing resin composition.

A thickness of the transparent substrate is not particularly limited and may be appropriately selected depending on the intended purpose. The thickness of the transparent substrate is preferably from 10 μm to 100 sm.

Also, the transparent substrate is preferably a moisture barrier film in terms of the ability to reduce hydrolysis of the inorganic phosphor particles.

The moisture barrier film is a gas barrier film obtained by forming a thin film of a metal oxide such as aluminum oxide, magnesium oxide, or silicon oxide on a plastic substrate or film of, for example, PET (polyethylene terephthalate). Alternatively, a multilayered structure such as PET/SiO$_x$/PET may be used.

A moisture transmittance of the barrier film is not particularly limited and may be appropriately selected depending on the intended purpose. The moisture transmittance of the barrier film is preferably about 0.05 g/m$^2$/day to about 5 g/m$^2$/day (e.g., a relatively low barrier performance of about 0.1 g/m$^2$/day). When it is within such a range, it is possible to suppress entry of moisture to protect the phosphor sheet from moisture.

Now, one example of the phosphor sheet will be described with reference to the drawings.

FIG. 1 is a schematic cross-sectional view illustrating an exemplary structure of the end of the phosphor sheet. This phosphor sheet includes a phosphor layer 11 sandwiched between a first moisture barrier film 12 and a second moisture barrier film 13.

The phosphor layer 11 includes the coated phosphor of the present invention and a resin, where the coated phosphor is dispersed in the resin.

In the phosphor sheet of FIG. 1, the end of the first moisture barrier film 12 and the end of the second moisture barrier film 13 are preferably sealed with a cover member 14 having a moisture transmittance of 1 g/m$^2$/day or less.

The cover member 14 may be an adhesive tape obtained by applying an adhesive 142 to a substrate 141 having a moisture transmittance of 1 g/m$^2$/day or less. The substrate 141 may be a metal foil such as an aluminum foil, or the moisture barrier films 12 and 13. The aluminum foil may be gloss white aluminum or may be non-gloss black aluminum. Use of white aluminum is preferable when a favorable color tone is needed for the end of the phosphor sheet. A width W of the cover member 14, which is attached onto the moisture barrier film, is preferably from 1 mm to 10 mm, more preferably 1 mm to 5 mm, from the viewpoints of moisture barrier property and strength. The cover member 14 having such a structure can prevent entry of moisture into the phosphor layer from the ends of the moisture barrier films, which makes it possible to prevent degradation of the phosphor in the phosphor layer.

(Light-Emitting Device)

A light-emitting device of the present invention includes the phosphor sheet of the present invention and if necessary further includes other members.

One example of the light-emitting device of the present invention will be described with reference to the drawings.

Figure 2:
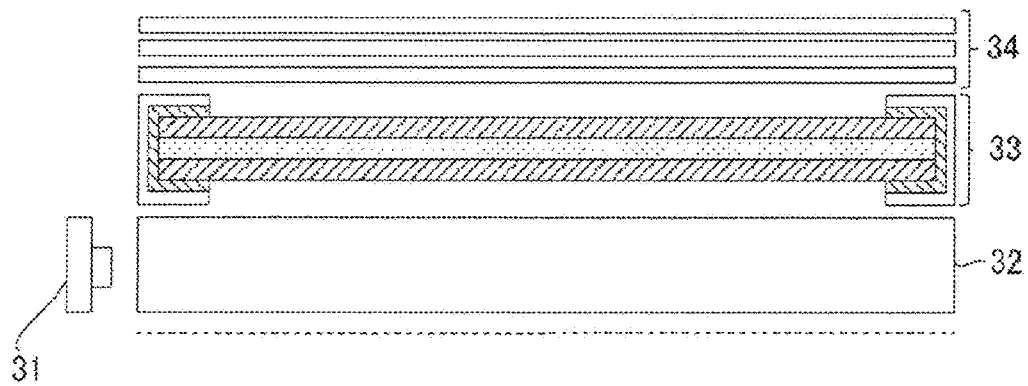
FIG. 2 is a schematic cross-sectional view illustrating an edge-light type light-emitting device.

FIG. 2 is a schematic cross-sectional view illustrating an edge-light type light-emitting device. As illustrated in FIG. 2, the light-emitting device constitutes a so-called "edge-light type backlight" including a blue LED 31, a light-guide plate. 32, which is configured to diffuse blue light of the blue LED 31 entering from the side surface thereof and emit uniform light to the surface thereof, a phosphor sheet 33, which is configured to obtain white light from the blue light, and an optical film 34.

The blue LED 31 constitutes a so-called "LED package" including a LED chip such as an InGaN-based chip, as a blue light-emitting element. The light-guide plate 32 is configured to achieve uniform plane emission of light receiving from the end surface of the transparent substrate such as an acrylic plate. The phosphor sheet 33 is, for example, the phosphor sheet illustrated in FIG. 1. Powder of the phosphor used in the phosphor sheet 33 has an average particle diameter of from several micrometers to several tens of micrometers. This makes it possible to increase the light-scattering effect of the phosphor sheet 33. The optical film 34 is composed of, for example, a reflection-type polarizing film and a diffusing film for increasing visibility of a liquid-crystal display device.

Figure 3:
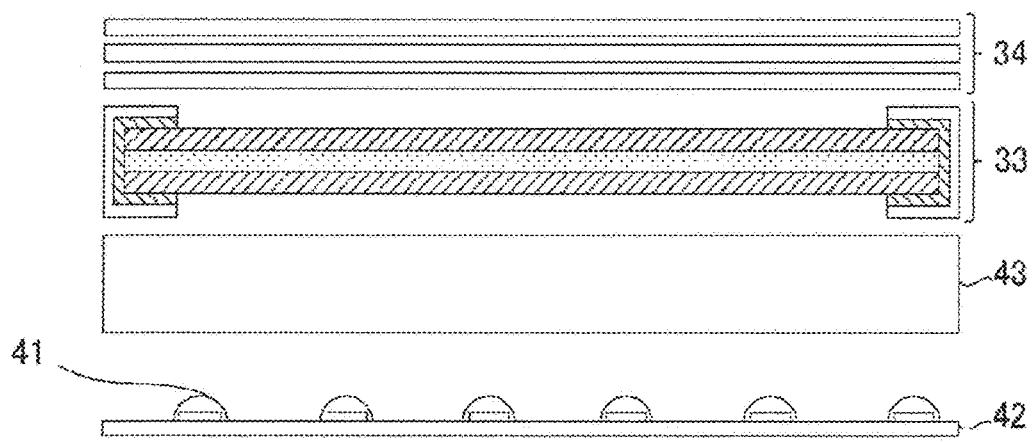
FIG. 3 is a schematic cross-sectional view illustrating a direct-type light-emitting device.

Also, FIG. 3 is a schematic cross-sectional view illustrating a direct-type light-emitting device. As illustrated in FIG. 3, the light-emitting device constitutes a so-called "direct-type backlight" including a substrate 42, where blue LEDs 41 are two-dimensionally arranged, a diffusing plate 43 configured to diffuse blue light of the blue LEDs 41, a phosphor sheet 33 spaced from the substrate 42 and configured to obtain white light from the blue light, and an optical film 34.

The blue LED 41 constitutes a so-called "LED package" including a LED chip such as an InGaN-based chip, as a blue light-emitting element. The substrate 42 is a glass cloth substrate using a resin such as phenol, epoxy, or polyimide. On the substrate 42, the blue LEDs 41 are two-dimensionally arranged at predetermined pitches and equal intervals so as to correspond to the entire surface of the phosphor sheet 33. If necessary, a surface of the substrate 42 on which the blue LEDs 41 are to be mounted may be subjected to a reflective treatment. The substrate 42 and the phosphor sheet 33 are disposed to have a spacing of about 10 nm to about 50 mm. The light-emitting device constitutes a so-called "remote phosphor structure". The gap between the substrate 42 and the phosphor sheet 33 is held with a plurality of support columns or a reflective plate. The support columns or the reflective plate are provided to surround the entire space formed between the substrate 42 and the phosphor sheet 33. The diffusing plate 43 diffuses radiated light from the blue LEDs 41 to such a wide range that the shapes of the light sources become invisible. The diffusing plate 43 has a total light transmittance of for example, 20% or higher but 80% or lower.

It is to be noted that the present invention is not limited to only the above-described embodiments, and it is needless to say that various modifications can be made without departing from the gist of the present invention. Although an example in which the light-emitting device is applied to a backlight light source for a display device has been described in the above-described embodiment, the light-emitting device may be applied to an illumination light source. When applied to an illumination light source, the optical film 34 is often unnecessary. The phosphor-containing resin may have not only a shape of a flat sheet but also a three-dimensional shape such as a cup shape.

EXAMPLES

The present invention will next be described by way of Examples. However, the present invention should not be construed as being limited to these Examples.

Production Example 1

<Production of sulfide phosphor $SrGa_2S_4$:Eu>
A powdered gallium compound was added to a solution containing a europium compound and a strontium compound, followed by addition of a salt to form a powder (specifically, the salt was added to precipitate the europium compound and the strontium compound to form the powder). After that, the powder was fired. Specifically, a powdered gallium compound was added to a solution containing a europium compound and a strontium compound, and then a salt was added to the resultant to form a powder of a mixture (powder mixture) of a powder containing europium and strontium and the powdered gallium compound.

After that, the powder (powder mixture) was fired. Here, a powdered gallium compound was added to a solution containing a europium compound and a strontium compound, and sulfite was added dropwise to the resultant to obtain a powder containing Sr, Eu, and Ga.

Specifically, the following method was performed.

First, $Ga_2O_3$ (purity: 7N), $Sr(NO_3)_2$ (purity: 3N), and $Eu_2O_3$ (purity: 3N), which are reagents available from Kojundo Chemical Lab. Co., Ltd., and an aqueous nitric acid solution (concentration: 20%) and ammonium sulfite monohydrate, which are available from KANTO CHEMICAL CO., INC., were provided.

$Eu_2O_3$ was added to the aqueous nitric acid solution, followed by stirring at 80° C. to dissolve $Eu_2O_3$ in the aqueous nitric acid solution. After that, the solvent was evaporated to obtain $Eu(NO_3)_3$.

Next, the europium compound [$Eu(NO_3)_3$] and the strontium compound [$Sr(NO_3)_2$] were added to 500 mL of pure water, followed by stirring. In this manner, a solution containing the europium compound and the strontium compound could be obtained. Changing the proportions of $Eu(NO_3)_3$ and $Sr(NO_3)_2$ can change the value of x to adjust the concentration of Eu as a light emission center. After that, a powdered gallium compound (specifically, powdered $Ga_2O_3$) was added to this solution at a desired proportion, and sulfite was added dropwise to the solution under stirring. Specifically, with this solution being stirred, a solution containing ammonium sulfite of moles 1.5 times the total moles of Sr and Eu was added dropwise, to obtain a deposited and precipitated product. The deposited and precipitated product contains Sr, Eu, and Ga, and is more specifically a mixture of a europium sulfite-strontium powder and a gallium oxide powder. The precipitated product was washed with pure water until the conductivity thereof would be 0.1 mS/cm or lower, followed by filtrating and then drying at 120° C. for 6 hours, to obtain a powder containing europium, strontium, and gallium (a mixture of a gallium oxide powder and a powder mixture of a mixture of the powdered gallium compound and the powder containing europium and strontium (more specifically, a powder of a europium sulfite-strontium powder [a powder of (Sr,Eu)$SO_3$]).

The thus-obtained powder (powder mixture) (20 g), zirconia balls (200 g), and ethanol (200 mL) were placed in a 500-mL pot, followed by mixing through rotation for 30 minutes at 90 rpm. After completion of mixing, the mixture was filtrated and dried at 120° C. for 6 hours. After that, the resultant was allowed to pass through a metal mesh having a nominal opening of 100 μm, to obtain a powder mixture product.

Next, the powder mixture product was fired in an electric furnace. Firing conditions are as follows. Specifically, the temperature was increased to 925° C. for 1.5 hours, then maintained at 925° C. for 1.5 hours, and then cooled to room temperature for 2 hours. During firing, hydrogen sulfide was allowed to flow into the electric furnace at a rate of 0.5 L/min. After that, the resultant was allowed to pass through a mesh having a nominal opening of 25 μm, to obtain a sulfide green phosphor ($SrGa_2S_4$:Eu) of $Sr_{1-x}Ga_2S_4$:$Eu_x$ (x is about 0.1). The obtained sulfide green phosphor ($SrGa_2S_4$:Eu) was found to have an average particle diameter of about 4 μm.

Production Example 2

<Production of Coated Phosphor>
A resin container (PE) was charged with the first formulation [10 g of the sulfide phosphor ($SrGa_2S_4$:Eu) produced in Production Example 1, 80 g of ethanol, 5 g of pure water, and 6 g of 28% aqueous ammonia]. A magnetic stirrer was placed in the first formulation, which was stirred for 10 minutes in a thermostat chamber of 40° C. After that, the second formulation (5 g of tetraethoxysilane and 35 g of ethanol) was added. Regarding as 0 minutes the time the addition of the second formulation was completed, stirring was performed for 3 hours. After completion of stirring, the mixture was treated through aspiration filtration using a vacuum pump, and the recovered sample was transferred to a beaker and washed with water and ethanol. After that, the resultant was filtrated again and the sample was recovered. The recovered sample was dried at 85° C. for 2 hours, followed by firing for 8 hours at 200° C. in the atmospheric environment, to obtain a coated phosphor.

The silicon oxide coating of the obtained coated phosphor was observed with a scanning electron microscope, and the average thickness thereof was 20 nm.

Examples 1 to 5

The coated phosphor obtained in Production Example 2 was subjected to inert high-temperature annealing under the following conditions using an atmosphere firing furnace.

Amount charged: from 0.2 g to 1.5 g of the coated phosphor

Atmosphere: $N_2$ gas purge

Set temperature: from 600° C. to 900° C.

Temperature profile: increased to the set temperature for 90 min, kept at the set temperature for 2 hours, and then naturally cooled After recovery of the particles from the firing furnace, the particles were classified with a mesh having an opening of 62 μm and were subjected to various evaluations (particle size distribution, SEM, and LED lighting test).

TABLE 1

| | Set temperature (° C.) |
|---|---|
| Ex. 1 | 600 |
| Ex. 2 | 750 |
| Ex. 3 | 825 |
| Ex. 4 | 850 |
| Ex. 5 | 900 |

Comparative Example 1

The coated phosphor obtained in Production Example 2 was used as a coated phosphor of Comparative Example 1.

<O/Si Amounts>

The coated phosphors of Examples 1 to 5 and Comparative Example 1 were measured for O/Si amounts. The measurement was performed in the following manner.

Figure 4:
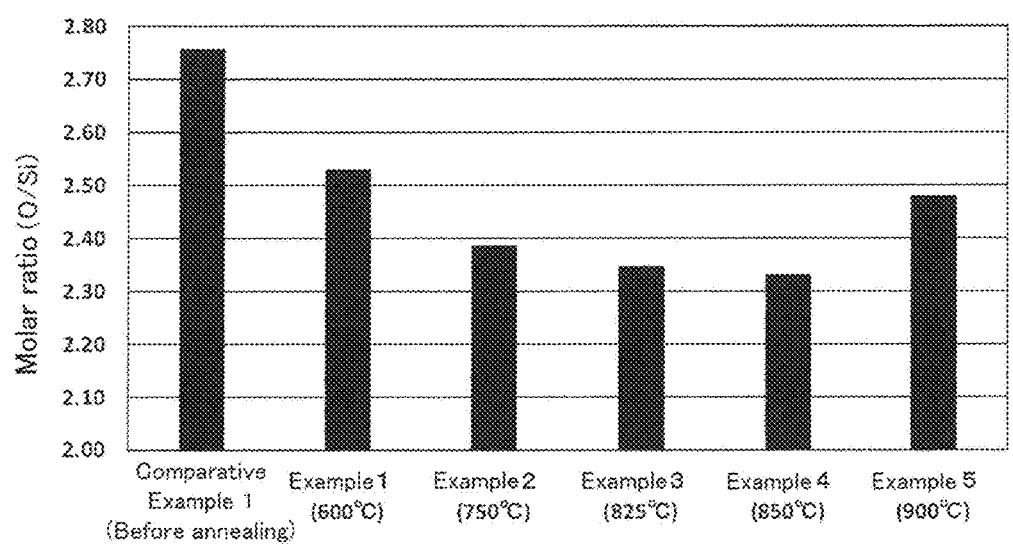
FIG. 4 is a graph of the molar ratio (O/Si) by ICP-AES analysis of the coated phosphors of Examples 1 to 5 and Comparative Example 1.

The coated phosphor (0.05 g) was weighed in a platinum crucible with 0.375 g of sodium carbonate and 0.125 g of boric acid. The mixture was melted by heating at 900° C., followed by cooling. 50% hydrochloric acid (5 mL) and hydrogen peroxide (2 mL) were added to the mixture, and precipitates that formed were recovered. The precipitates were dissolved in a 10% aqueous nitric acid solution to obtain a solution. The solution was subjected to ICP atomic emission spectroscopy (ICP-AES). A ratio of the obtained peak intensities of O (oxygen atom) and Si (silicon atom) was used to determine a molar ratio (O/Si) of O to Si in the silicon oxide coating. Results are presented in Table 2 and FIG. 4.

TABLE 2

| | Comp. Ex. 1 | Ex. 1 | Ex. 2 | Ex. 3 | Ex. 4 | Ex. 5 |
|---|---|---|---|---|---|---|
| Set temperature (° C.) | Before annealing | 600 | 750 | 825 | 850 | 900 |
| O/Si ratio | 2.76 | 2.53 | 2.39 | 2.35 | 2.33 | 2.48 |

The coated phosphor that had not been subjected to annealing had a molar ratio (O/Si) of O to Si of 2.76, whereas Examples 1 to 5 that had been subjected to annealing had a lower molar ratio (O/Si); i.e., 2.60 or lower.

<SEM Observation>

The coated phosphor was observed with SEM (scanning electron microscope). Results are presented in FIG. 5A to FIG. 5E. The coated phosphor used here was a coated phosphor that had been produced in the same manner as in Production Example 2 so that the silicon oxide coating had a large average thickness of 70 nm. The coated phosphor having the thick silicon oxide coating was produced in Production Example 2 by increasing the concentration of tetraethoxysilane.

Figure 5A:
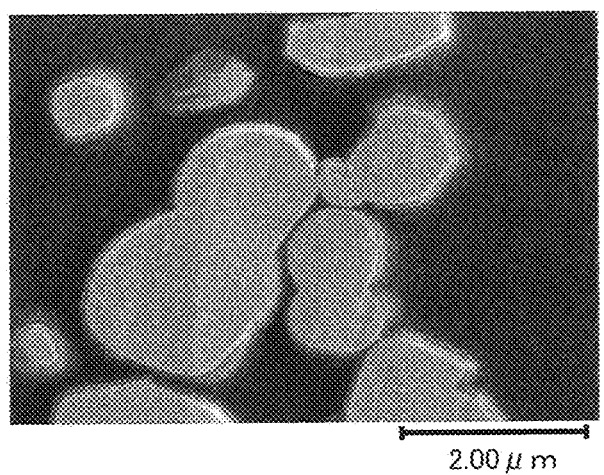
FIG. 5A is a SEM image of the coated phosphor that is not subjected to annealing.

FIG. 5A is a SEM image of the coated phosphor that was not subjected to annealing.

Figure 5B:
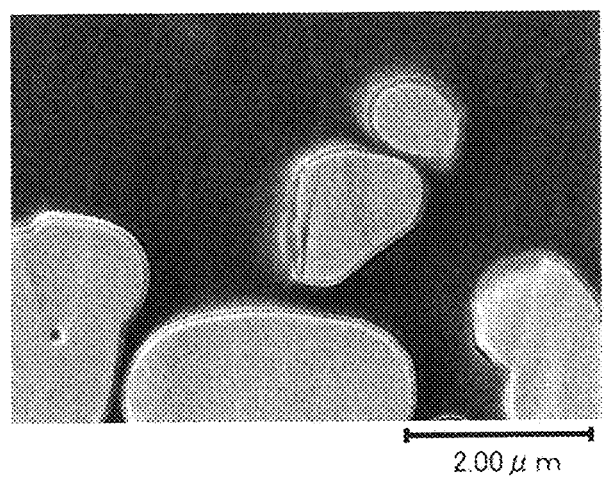
FIG. 5B is a SEM image of the coated phosphor that is subjected to annealing at 600° C.

FIG. 5B is a SEM image of the coated phosphor that was subjected to annealing at 600° C.

Figure 5C:
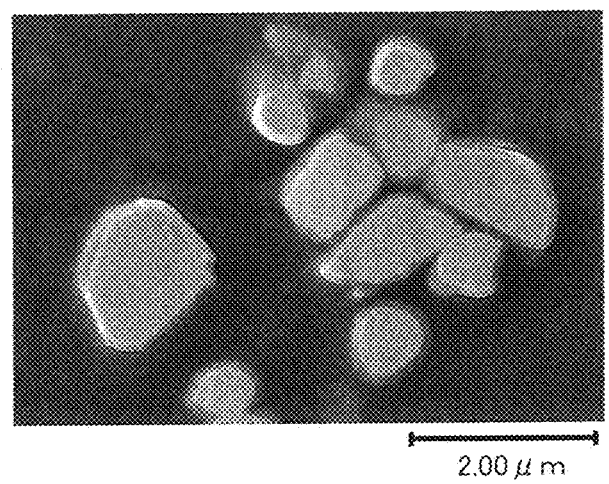
FIG. 5C is a SEM image of the coated phosphor that is subjected to annealing at 700° C.

FIG. 5C is a SEM image of the coated phosphor that was subjected to annealing at 700° C.

Figure 5D:
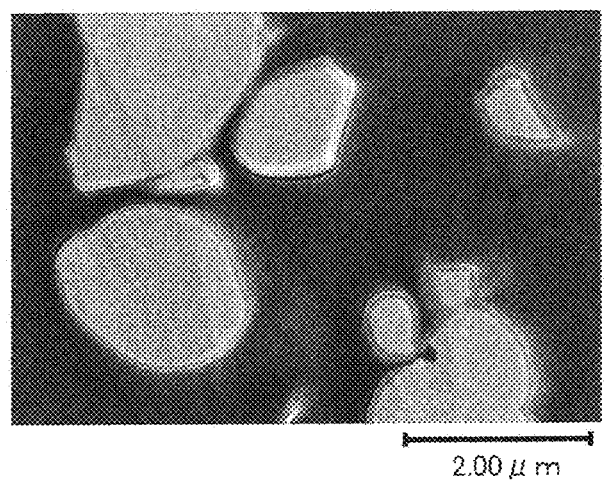
FIG. 5D is a SEM image of the coated phosphor that is subjected to annealing at 800° C.

FIG. 5D is a SEM image of the coated phosphor that was subjected to annealing at 800° C.

Figure 5E:
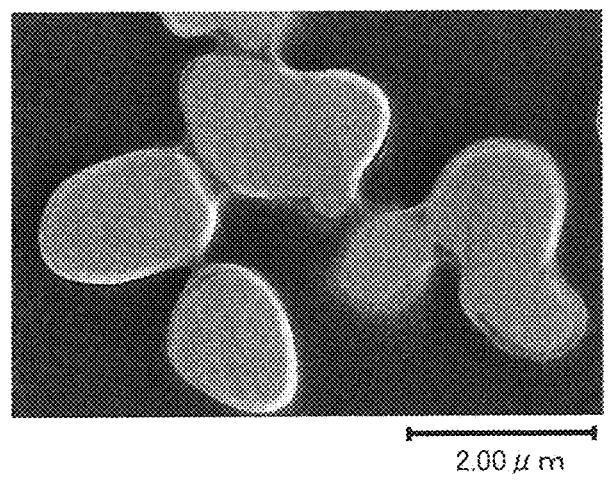
FIG. 5E is a SEM image of the coated phosphor that is subjected to annealing at 900° C.

FIG. 5E is a SEM image of the coated phosphor that was subjected to annealing at 900° C.

When the annealing temperature was 900° C., coalescence of portions of the silicon oxide coating could be confirmed (FIG. 5E).

When the annealing temperature was lower than 900° C., no coalescence was observed. As in Table 2, however, the O/Si decreased even at an annealing temperature of lower than 900° C. It is considered that compactness of the silicon oxide coating occurs even at a temperature of 900° C. or lower.

<Reliability Evaluation>

The coated phosphor obtained in Production Example 2 was subjected to annealing in the same manners as in Examples 1 to 5. The annealing temperature was set to 600° C., 700° C., 800° C., and 900° C.

The coated phosphor after the annealing or the coated phosphor of Comparative Example 1 was dispersed in a resin (methyl-based KER-2910) in a LED package. The resin was cured to obtain the LED package containing the coated phosphor. This LED package was subjected to a lighting/storage test.

Test conditions were that current was continuously applied at 140 mA for 504 hours to the LED under the 70° C., 85% RH environment. Here, the initial luminous flux maintenance rate (lm %) and chromaticity fluctuation (Δu'v') were confirmed. In addition, the initial luminous flux maintenance rate (lm %) and chromaticity fluctuation (Δu'v') were also confirmed when the LED was stored for 504 hours under the 70° C., 85% RH environment with no current applied (non-lighting state).

Details of the measurement are as follows. A light measurement device (available from Labsphere Co., system model name: "CSLMS-LED-1061". Model: 10 inch (Φ25)/LMS-100) was used to measure a spectrum of spectral radiant flux (intensity: W/nm) with an integrating sphere, and measure the total luminous flux (lumen: lm) and chromaticity points u', V on the u'v' color space coordinates. After obtaining data before accelerated environmental testing for the above parameters, sample data after accelerated environmental testing for a certain period of time were measured similarly. The obtained values and data were used for the following calculation to calculate the lm fluctuation rate (%) (luminous flux maintenance rate) and the chromaticity fluctuation index (Δu'v') from the initial values.

lm fluctuation rate (%): (lm after testing/initial lm)×100

Figure 6A:
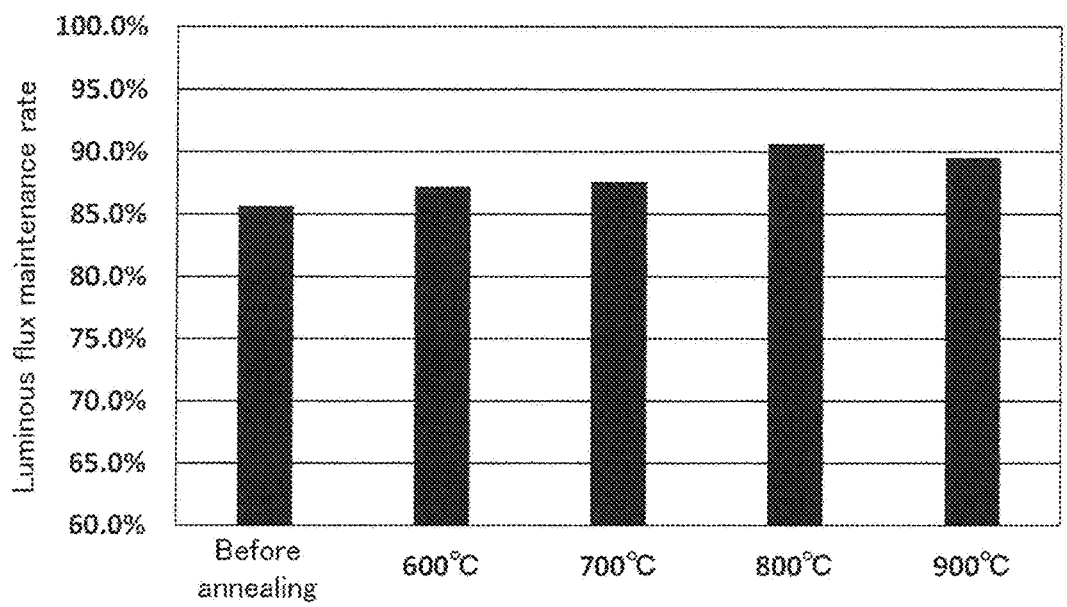
FIG. 6A is a graph of results of a luminous flux maintenance rate when current is applied at 140 mA in a reliability test.
Figure 6B:
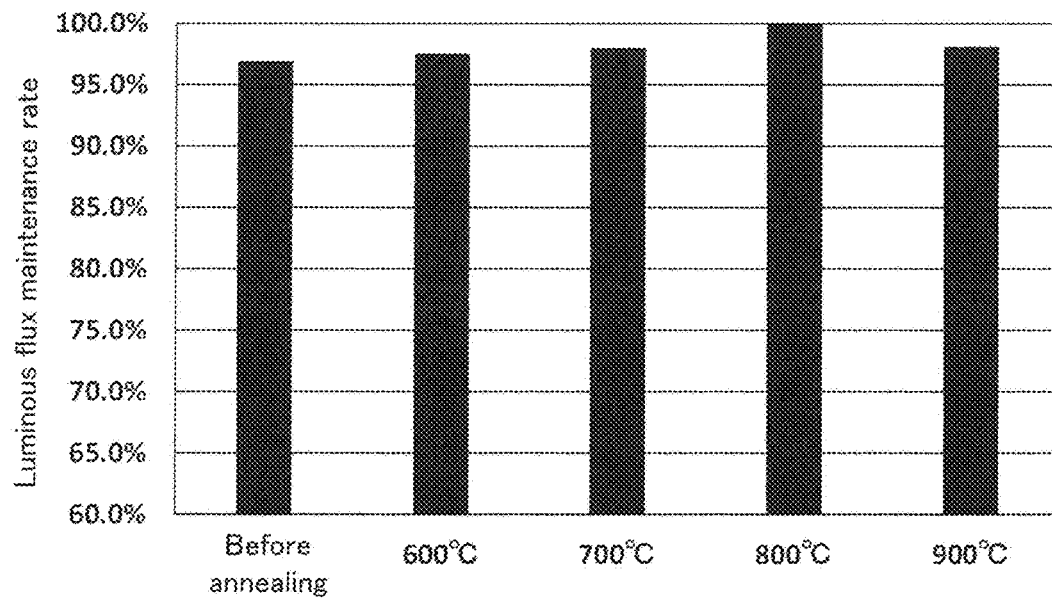
FIG. 6B is a graph of results of a luminous flux maintenance rate in the case of storage (non-lighting state) in a reliability test.

$\Delta u'v':\sqrt{(\Delta u'^2+\Delta v'^2)}$, where $\Delta u'$=initial $u'$-$u'$ after the time passed Results of the luminous flux maintenance rate are presented in Table 3-1 and Table 3-2 and FIG. 6A and FIG. 6B.

Table 3-1 and FIG. 6A are the results obtained when current was applied at 140 mA.

Table 3-2 and FIG. 6B are the results obtained in the case of storage in the above manner (non-lighting state).

TABLE 3-1

| Set temperature (° C.) | Before annealing | 600° C. | 700° C. | 800° C. | 900° C. |
|---|---|---|---|---|---|
| Luminous flux maintenance rate | 85.6% | 87.2% | 87.6% | 90.6% | 89.5% |

TABLE 3-2

| Set temperature (° C.) | Before annealing | 600° C. | 700° C. | 800° C. | 900° C. |
|---|---|---|---|---|---|
| Luminous flux maintenance rate | 96.9% | 97.5% | 98.0% | 100.1% | 98.1% |

Figure 7A:
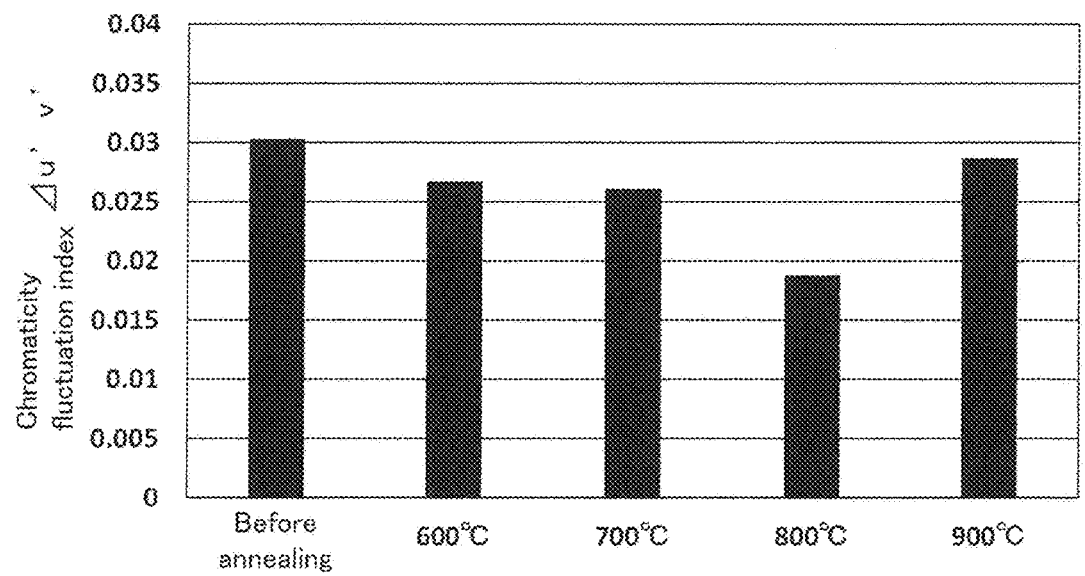
FIG. 7A is a graph of results of a chromaticity fluctuation index when current is applied at 140 mA in a reliability test.
Figure 7B:
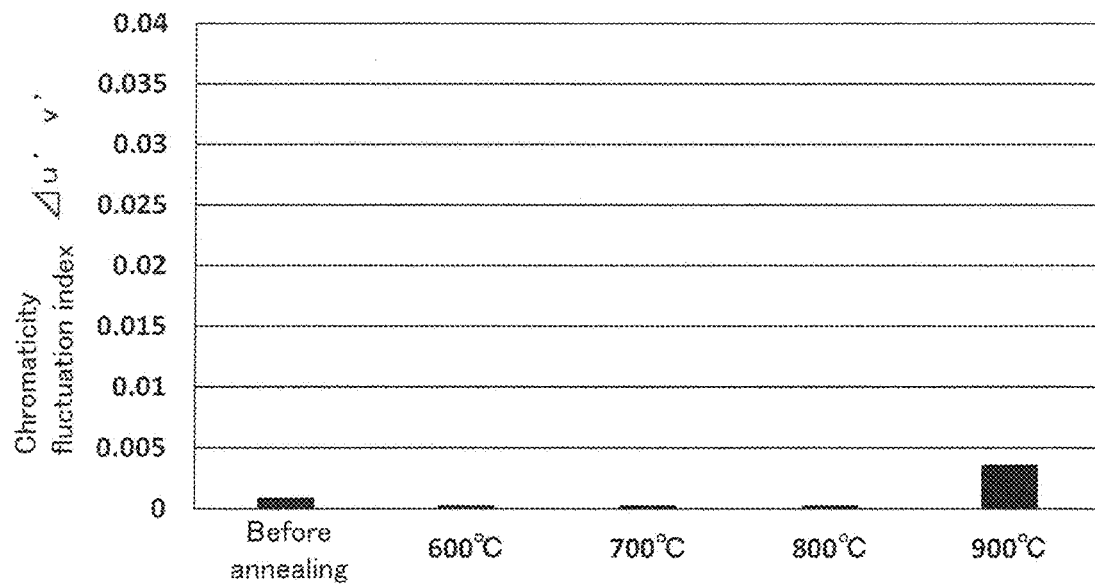
FIG. 7B is a graph of results of a chromaticity fluctuation index in the case of storage (non-lighting state) in a reliability test.

Results of the chromaticity fluctuation index (Δu'v') are presented in Table 4-1 and Table 4-2 and FIG. 7A and FIG. 7B.

Table 4-1 and FIG. 7A are the results obtained when current was applied at 140 mA.

Table 4-2 and FIG. 7B are the results obtained in the case of storage in the above manner (non-lighting state).

TABLE 4-1

| Set temperature (° C.) | Before annealing | 600° C. | 700° C. | 800° C. | 900° C. |
|---|---|---|---|---|---|
| Chromaticity fluctuation index (Δu'v') | 0.0303 | 0.0267 | 0.0261 | 0.0188 | 0.0287 |

TABLE 4-2

| Set temperature (° C.) | Before annealing | 600° C. | 700° C. | 800° C. | 900° C. |
|---|---|---|---|---|---|
| Chromaticity fluctuation index (Δu'v') | 0.0009 | 0.0003 | 0.0003 | 0.0003 | 0.0036 |

From these results, it has been found that when the molar ratio (O/Si) of oxygen atom to silicon atom in the silicon oxide coating is 2.60 or less, the luminous flux maintenance rate is higher and the chromaticity fluctuation is smaller in use under a high-temperature, high-humidity environment in a state where the LEDs are lit, as compared with the case where it is more than 2.60.

In the case of non-lighting, no significant change (reduction) in the luminous flux maintenance rate and the chromaticity fluctuation was observed in both Comparative Examples and Examples.

INDUSTRIAL APPLICABILITY

The coated phosphor of the present invention is excellent in stability under a high-temperature, high-humidity environment in a state where LEDs are lit, and thus can be suitably used in a light-emitting device used for a long period of time.

The invention claimed is:

1. A coated phosphor comprising:
an inorganic phosphor particle; and
a silicon oxide coating that coats the inorganic phosphor particle,
wherein an average thickness of the silicon oxide coating is from 3 nm to 200 nm,
wherein a molar ratio (O/Si) of an oxygen atom to a silicon atom in the silicon oxide coating through ICP emission spectroscopy of the coated phosphor is 2.3 or more and 2.60 or less, and
wherein the inorganic phosphor particle is represented by any one of General Formula (1) to General Formula (3) below:

$Sr_{1-x}Ga_2S_4:Eu_x$            General Formula (1);

$(Sr_{1-y}Ca_y)_{1-x}Ga_2S_4:Eu_x$            General Formula (2); and $(Ba_zSr_{1-z})_{1-x}Ga_2S_4:Eu_x$            General Formula (3), where in the General Formulas (1) to (3), x satisfies 0<x<1, y satisfies 0<y<1, and z satisfies 0<z<1.

2. The coated phosphor according to claim 1, wherein a light-emission local maximum wavelength of the coated phosphor is from 500 nm to 600 nm.

3. The coated phosphor according to claim 1, therein an average particle diameter of the coated phosphor is from 0.5 μm to 30 μm.

4. The coated phosphor according to claim 1, wherein a particle diameter D90 of the coated phosphor is 40 μm or less.

5. A phosphor sheet comprising
the coated phosphor according to claim 1.

6. A light-emitting device comprising
the phosphor sheet according to claim 5.

7. A coated phosphor comprising:
an inorganic phosphor particle; and
a silicon oxide coating that coats the inorganic phosphor particle,
wherein an average particle diameter of the coated phosphor is from 0.5 μm to 30 μm,
wherein a molar ratio (O/Si) of an oxygen atom to a silicon atom in the silicon oxide coating through ICP emission spectroscopy of the coated phosphor is 2.3 or more and 2.60 or less, and
wherein the inorganic phosphor particle is represented by any one of General Formula (2) and General Formula (3) below:

$(Sr_{1-y}Ca_y)_{1-x}Ga_2S_4:Eu_x$            General Formula (2); and $(Ba_zSr_{1-z})_{1-x}Ga_2S_4:Eu_x$            General Formula (3), where in the General Formulas (2) and (3), x satisfies 0<x<1, y satisfies 0<y<1, and z satisfies 0<z<1.

8. The coated phosphor according to claim 7, wherein an average thickness of the silicon oxide coating is from 3 nm to 200 nm.

9. The coated phosphor according to claim 7, wherein a light-emission local maximum wavelength of the coated phosphor is from 500 nm to 600 nm.

10. The coated phosphor according to claim 7, wherein a particle diameter D90 of the coated phosphor is 40 μm or less.

11. A phosphor sheet comprising
the coated phosphor according to claim 7.

12. A light emitting device comprising
the phosphor sheet according to claim 11.

13. A coated phosphor comprising:
an inorganic phosphor particle; and
a silicon oxide coating that coats the inorganic phosphor particle,
wherein a particle diameter D90 of the coated phosphor is 40 μm or less,
wherein a molar ratio (O/Si) of an oxygen atom to a silicon atom in the silicon oxide coating through ICP emission spectroscopy of the coated phosphor is 2.3 or more and 2.60 or less, and
wherein the inorganic phosphor particle is represented by any one of General Formula (2) and General Formula (3) below;

$(Sr_{1-y}Ca_y)_{1-x}Ga_2S_4:Eu_x$ General Formula (2); and $(Ba_zSr_{1-z})_{1-x}Ga_2S_4:Eu_x$ General Formula (3), where in the General Formulas (2) and (3), x satisfies 0<x<1, y satisfies 0<y<1, and z satisfies 0<z<1.

* * * * *